United States Patent [19]

Holroyd

[11] Patent Number: 4,688,429

[45] Date of Patent: Aug. 25, 1987

[54] DETERMINATION OF THE SPECTRAL CONTENT OF TRANSIENT STRESS WAVE EVENTS

[75] Inventor: Trevor J. Holroyd, Derby, England

[73] Assignee: Rolls-Royce plc, London, England

[21] Appl. No.: 837,031

[22] Filed: Mar. 6, 1986

[30] Foreign Application Priority Data

Apr. 17, 1985 [GB] United Kingdom ................ 8509836

[51] Int. Cl.$^4$ ............................................. G01N 29/00
[52] U.S. Cl. ....................................... 73/602; 73/579; 73/586; 73/599
[58] Field of Search ................... 73/602, 579, 586, 599

[56] References Cited

U.S. PATENT DOCUMENTS 3,572,099  3/1971  Wieczoirek ........................... 73/602
4,218,924  8/1980  Fortunko et al. ..................... 73/642
4,593,568  6/1986  Telford et al. ........................ 73/623

OTHER PUBLICATIONS

*Ultrasonic Technology*, Goldman, 1962, Reinhold Publ. Comp., pp. 21–24.
*Ultrasonic Testing of Materials*, Krautkramer, 1975, Springer-Verlag.

*Primary Examiner*—Howard A. Birmiel
*Attorney, Agent, or Firm*—Cushman, Darby & Cushman

[57] ABSTRACT

The spectral content of a transient stress wave event occuring on a plate-like structure is determined by locating a transducer on the surface of the structure at a position remote from the location of the transient stress wave event. Lamb waves resulting from and characteristic of the transient stress wave event propogate through the plate-like structure in a dispersive manner to be intercepted by the transducer. Analysis of the transducer output enables the spectral content of the transient stress wave event to be realized.

6 Claims, 4 Drawing Figures

DETERMINATION OF THE SPECTRAL CONTENT OF TRANSIENT STRESS WAVE EVENTS

This invention relates to the determination of the spectral content of transient stress wave events in plate-like structures.

It is frequently desirable to determine the spectral content of transient stress wave events. Analysis of the resultant spectral content may be utilised, for instance, in the calibration of broad frequency band acoustic emission transducers and the characterisation of impacts upon structures. Impact characterisation can be very useful in sorting applications in which a number of articles sequentially impacting a given surface are to be sorted between like and unlike articles. The spectral content of transient stress events involving the like articles are similar and not the same as the spectral content of transient stress wave events involving the unlike articles.

Spectral content determination of transient stress wave events can be achieved with the use of a transient recorder and computational (Fourier Transform) analysis. However this tends to be complicated and expensive.

It is an object of the present invention to provide a method of and apparatus for the spectral content determination of transient stress wave events in plate-like structures which is characterised both by greater simplicity and cheapness than has heretofore been achieved.

According to the present invention, a method of determining at least a portion of the spectral content of a transient stress wave event occuring on one surface of a plate-like structure having opposed surfaces comprises locating a transducer on one of said surfaces which transducer is responsive to and has an output representative of any displacement of said surface upon which it is mounted, causing a traniseнт stress wave event to take place on one of said surfaces at a position remote from said transducer so that Lamb waves resulting from and characteristic of said stress wave event propogate through said plate-like structure in dispersive manner to cause correspondingly characteristic displacement of said surfaces including that portion of the surface upon which said transducer is mounted, analysing the output of said transducer to determine the characteristics of said Lamb waves and deriving therefrom at least a portion of the spectral content of said transient stress wave event.

According to a further aspect of the present invention, apparatus suitable for the determination of at least a portion of the spectral content of a transient stress wave event comprises a plate-like structure having opposed surfaces, a transducer located on one of those opposed surfaces which transducer is responsive to and has an output representative of any displacement of the surface upon which it is mounted, and signal processing means adapted to monitor and process the output of said transducer, said plate-like structure being so disposed as to be subject to the occurence of a transient stress-wave event on one of said surfaces thereof at a position remote from said transducer so that Lamb waves resulting from and characteristic of any such stress wave event propogate through said plate-like structure in a dispersive manner to cause correspondingly characteristic displacement of said surfaces including that portion of the surface upon which said transducer is mounted, said signal processing means being adapted to monitor and process the output of said transducer in such a manner as to provide an indication of those characteristics of said Lamb waves from which at least a portion of the spectral content of any such stress wave event may be derived.

The invention will now be described, by way of example, with reference to the accompanying drawings in which.

Figure 1:
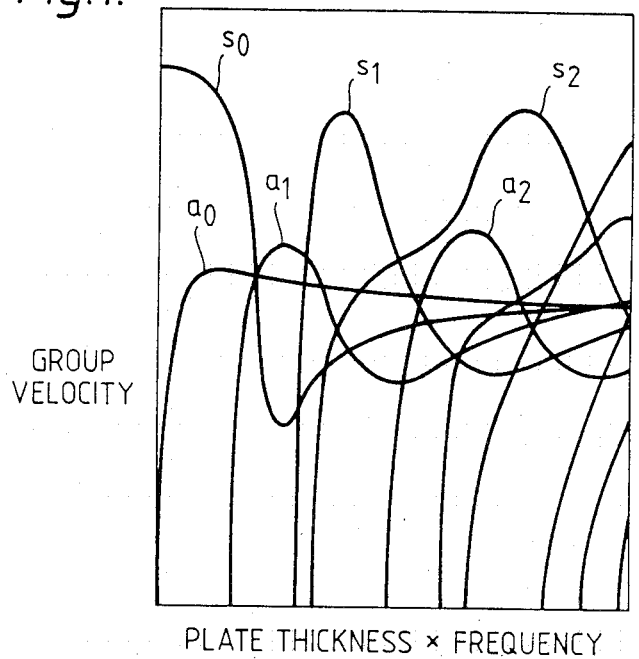
FIG. 1 is a graph indicating the dependence of Lamb wave group velocity on frequency and plate thickness.

If a plate-like structure is subject to a transient stress wave even on one of its surfaces, for instance impact by an object, resultant stress waves propogate through that structure as Lamb waves. Lamb waves (or plate waves as they are sometimes referred to) are characterised by wave activity across the opposed surfaces of the plate-like structure. The wave activity across the opposed surfaces is interelated so that the waves are either in or out of phase with each other. These are referred to as being antisymmetric or symmetric. Moreover a family of symmetric and antisymmetric Lamb wave modes is possible following a transient stress wave event as can be seen from FIG. 1. FIG. 1 illustrates the dependence of Lamb wave group velocity within a plate-like structure on frequency and plate thickness, those waves designated $s_o$ to $s_2$ being symmetric and those designated $a_o$ to $a_2$ being antisymmetric. FIG. 1 also illustrates a further important property of Lamb waves viz. that they are dispersive. Thus the velocity of propogation of Lamb waves is dependent upon wave frequency.

It is the dispersive nature of Lamb waves which is utilised in the method and apparatus of the present invention. Thus the present invention relies upon the dispersion of Lamb waves to separate the various frequency components which are contained in a localised transient stress wave.

Figure 2:
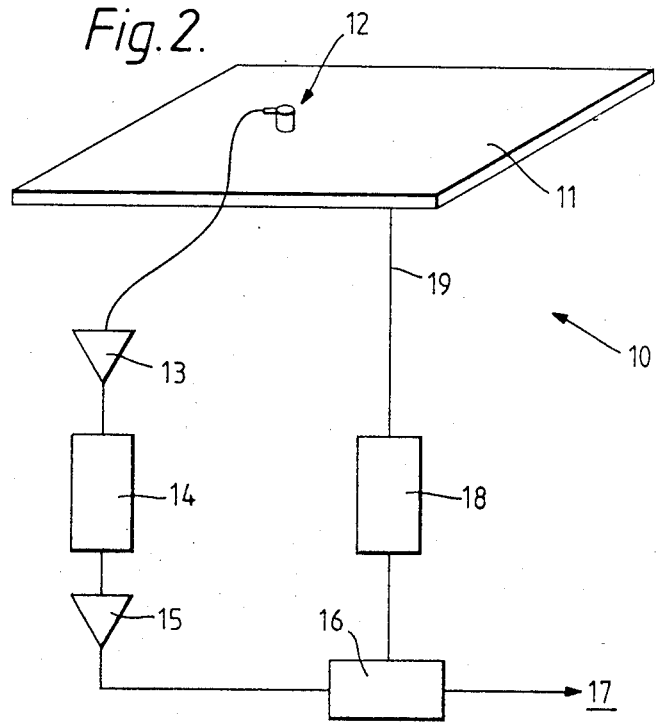
FIG. 2 is a diagrammatic representation of apparatus in accordance with the present invention.

Referring to FIG. 2, the apparatus of the present invention is generally indicated at 10. The apparatus 10 comprises a plate 11 formed from the nickel base alloy known as Nimonic 75 having a piezo-electric transducer 12 attached to its upper surface. The piezo-electric transducer 12 is responsive to a broad band of frequencies and is adapted to provide an electrical output which is characteristic of any displacement of the surface of the plate 11 to a charge amplifier 13. The output of the charge amplifier 13 is fed to an envelope follower 14, the output of which is fed in turn to a logarithmic amplifier 15. The logarithmic amplifier 15 output is directed to a sample and hold device 16 and thence to an appropriate display device 17, the output of the sample and hold device 16 being controlled by a pulse generator 18.

The apparatus 10 is used in the determination of the spectral content of a localised transient stress wave event occuring on the same surface of the plate 11 as the transducer 12 but originating at a position 19 which is remote from the transducer 12. The particular transient event chosen to investigate the characteristics of the present invention was the breaking of a pencil lead on the plate 11 at the position 19. It will be appreciated however other transient events such as impacts, step release functions or rapid localised thermal expansion could be utilised if so desired. Moreover it will be appreciated that since Lamb waves result in characteristic displacement of both the upper and lower faces of the plate 11, the transducer could be positioned on the lower face if so desired.

In order to simplify the interpretation of the waveforms resulting from the localised transient stress wave event at 19, we prefer to arrange for the propogation of the waves to be predominantly in only one of the Lamb modes and for the group velocity not to pass through a maxima or minima. This can be achieved by ensuring that the plate 11 is of a constant thickness which is selected so that the following expression is satisfied:

$$d < C/2\pi f$$

where
 d = plate half thickness
 C = shear wave velocity
 f = maximum frequency in the bandwidth of interest.

Under these conditions, the lowest order antisymmetric mode ($a_o$) predominates and the velocity of propogation increases in a non-linear manner with frequency. Thus when the localised transient stress wave event is generated by the breaking of the pencil lead at the position 19, the various frequency components associated with that event become physically separated across the plate 11 as they propogate as Lamb waves. The resultant surface displacement detected by the transducer 12 results in it providing an electrical output characteristic of that displacement and hence the frequency components of the transient stress wave event as can be seen from FIG. 3.

Figure 3:
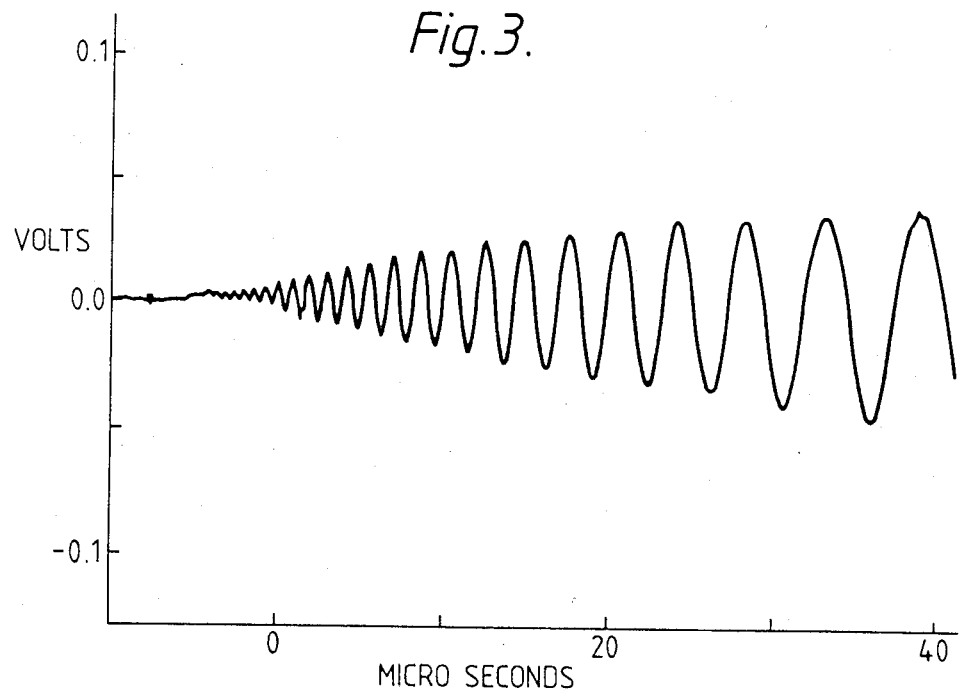
FIG. 3 is a graph indicating the detected surface displacement of a plate surface at a distance of 90 mm from a transient stress wave event.
Figure 4:
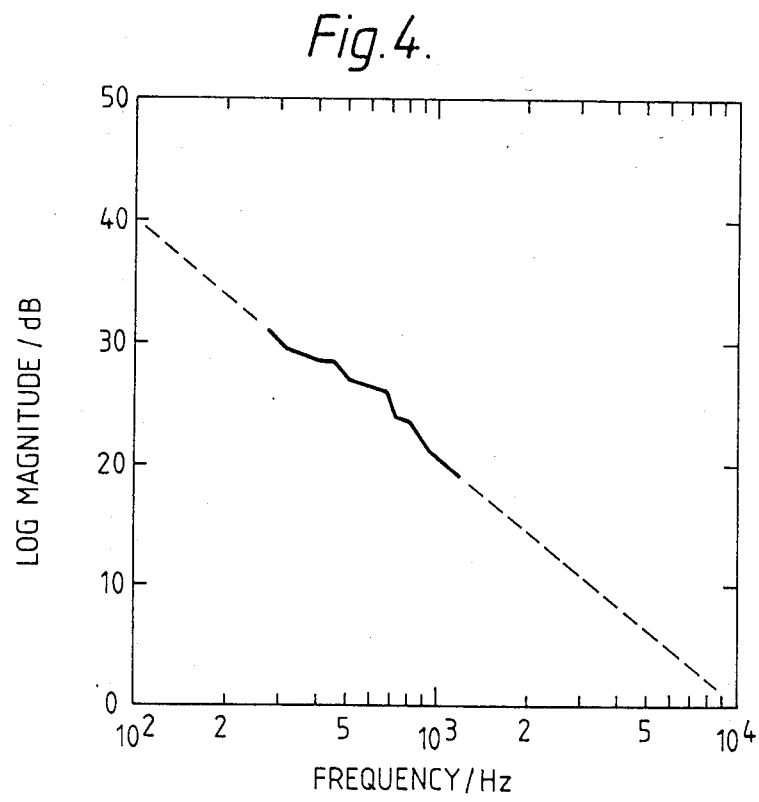
FIG. 4 is an indication of the spectral content of the transient stress wave event causing the surface displacement indicated in FIG. 3.

A simple analysis of the amplitudes and periods of the oscillations in the waveform shown in FIG. 3 was used to arrive at the spectrum shown in FIG. 4. The amplitude scale of FIG. 4 is logarithmic and it will be noted that the approximately linear negative slope at 20 dB/decade of the spectrum indicates a 1/f dependence. This confirms the method of the present invention as an effective method of spectral content determination since it is well known that a step function (such as a pencil lead break) has a spectral content with a 1/frequency dependence.

The above analysis of the output of the transducer 12 is relatively crude and it is therefore desirable to provide a more effective means for processing the output. This is achieved by suitable conditioning of the transducer 12 output signal by the charge amplifier 13, envelope follower 14 and logarithmic amplifier 15. The conditioned signal is then passed to the sample and hold device 16 the output of which is, as previously stated, controlled by the pulse generator 18. The operation of the pulse generator 18 is initiated by a signal via line 19 from an appropriate detector (not shown) positioned adjacent the source of the transient stress wave event upon the occurence of the transient stress wave event. The pulse generator then causes the sample and hold device 16 to pass a signal to the display device 17 at discrete time periods corresponding with the passage of frequency components of the transient stress wave event passing the transducer 12. Thus as previously stated the various frequency components of the transient stress wave event propogate as Lamb waves through the plate 11 at different rates. Consequently the frequency component of the waveform which is intercepted by the transducer 12 at any point is determined from the total propogation time since this can be related to frequency using the theorectical solution as plotted in FIG. 1 and making use of the relationship velocity = distance/time.

The display provided by the device 17 can therefore be of the total spectral content of the transient stress wave event if so desired. This could be useful in the calibration of an unknown transducer 12 using a known transient stress wave event.

It may be desirable in other circumstances however to sample only parts of the spectral content of a transient stress wave event which are known to be characteristic of that event. This could be useful, for instance, in the sorting of components. A succession of components would be dropped under identical conditions on to the same location on the plate 11. If any of those components were to be, for instance, of different hardness to the remainder, it would cause a transient stress wave event having a different spectral content to that characteristic of the remainder of the components. It will be appreciated however that other different component characteristics could be utilised if so desired. For instance mention may be made of Youngs Modulus, Poissons ratio, radius at the point of impact, velocity and mass. This would be highlighted by the display on the device 17, thereby giving an indication of the presence of a non-standard component.

It will be seen therefore that the method and apparatus of the present invention provide a simple and cheap means for deriving the spectral content of a transient stress wave event.

I claim:

1. A method of determining at least a portion of the spectral content of an event generating transient stress wave occuring on one surface of a plate-like structure having opposed surfaces comprising locating a transducer on one of said surfaces which transducer is responsive to and has an output representative of any displacement of said surface upon which it is mounted, causing a transient stress wave event to take place on one of said surfaces at a position remote from said transducer so that Lamb waves resulting from and characteristic of said transient stress wave event propogate through said plate like structure in a dispersive manner to cause correspondingly characteristic displacement of said surfaces including that portion of the surface upon which said transducer is mounted, analysing the output of said transducer to determine the characteristics of said Lamb waves and deriving therefrom at least a portion of the spectral content of said transient stress wave event.

2. A method of determining at least a portion of the spectral content of an event generating a transient stress wave as claimed in claim 1 wherein said opposed surfaces of said plate-like structure are parallel.

3. A method of determining at least a portion of the spectral content of an event generating a transient stress wave as claimed in claim 2 wherein $$d < C/2\pi f$$

where
 d = plate half thickness
 C = shear wave velocity
 f = maximum frequency in the bandwidth of interest.

4. A method of determining at least a portion of the spectral content of an event generating a transient stress wave as claimed in claim 1 wherein the analysis of the output of said transducer and the derivation of said at least a portion of the spectral content of said transient stress wave event comprises appropriately conditioning said transducer ouput and subsequently sampling and displaying said output at discrete time intervals from the occurence of said transient stress wave event in accordance with the rate of propogation of the frequency components of said transient stress wave event through said plate-like structure.

5. A method of determining at least a portion of the spectral content of an event generating a transient stress wave as claimed in claim 4 wherein said transducer output is appropriately conditioned by a charge amplifier, an envelope follower and a logarithmic amplifier.

6. Apparatus suitable for the determination of at least a portion of the spectral content of an event generating a transient stress wave comprising a plate-like structure having opposed surfaces, a transducer located on on one of the opposed surfaces which transducer is responsive to and has an output representative of any displacement of the surface upon which it is mounted, and signal processing means adapted to monitor and process the output of said transducer, said plate-like structure being so disposed as to be subject to the occurence of a transient stress wave event on one of the surfaces thereof at a position remote from said transducer so that Lamb waves resulting from and characteristic of any such stress wave event propagate through said plate-like structure in a dispersive manner to cause correspondingly characteristic displacement of said surfaces including that portion of the surface upon which said transducer is mounted, said signal processing means being adapted to monitor and process the output of said transducer in such a manner as to provide an indication of those characteristics of said Lamb waves from which at least a portion of the spectral content of any such stress wave event may be derived.

* * * * *